United States Patent [19]
Gonsiorawski et al.

[11] Patent Number: 4,612,698
[45] Date of Patent: * Sep. 23, 1986

[54] METHOD OF FABRICATING SOLAR CELLS

[75] Inventors: Ronald C. Gonsiorawski, Danvers; Douglas A. Yates, Burlington, both of Mass.

[73] Assignee: Mobil Solar Energy Corporation, Waltham, Mass.

[*] Notice: The portion of the term of this patent subsequent to Dec. 10, 2002 has been disclaimed.

[21] Appl. No.: 681,001

[22] Filed: Dec. 13, 1984

Related U.S. Application Data

[63] Continuation-in-part of Ser. No. 666,972, Oct. 31, 1984, abandoned, which is a continuation of Ser. No. 563,292, Dec. 19, 1983, abandoned.

[51] Int. Cl.[4] ............................................. H01L 31/18
[52] U.S. Cl. .................................... 29/572; 29/576 B; 29/591; 148/1.5; 250/492.2; 204/15; 427/74; 427/88; 427/89; 427/90; 427/92; 136/256
[58] Field of Search ............... 148/1.5; 29/572, 576 B, 29/590, 591; 427/74, 88, 91, 92, 38, 89, 90; 136/256, 255; 250/492.2; 204/15, 38 B

[56] References Cited

U.S. PATENT DOCUMENTS

| | | | |
|---|---|---|---|
| 3,805,376 | 4/1974 | D'Asaro | 29/570 |
| 4,086,102 | 4/1978 | King | 136/256 |
| 4,224,084 | 9/1980 | Pankove | 148/1.5 |
| 4,322,253 | 3/1982 | Pankove | 148/1.5 |

Primary Examiner—Aaron Weisstuch
Attorney, Agent, or Firm—Schiller & Pandiscio

[57] ABSTRACT

A solar cell fabrication procedure is described which is characterized by (1) forming a front surface mask in the configuration of the front surface electrodes, (2) a passivation step which, inter alia, results in the formation of an altered silicon substrate surface layer in the areas not covered by the front surface mask, (3) removal of the front surface mask, and (4) the use of the altered surface layer as a plating mask for subsequent metallization steps.

16 Claims, 1 Drawing Figure

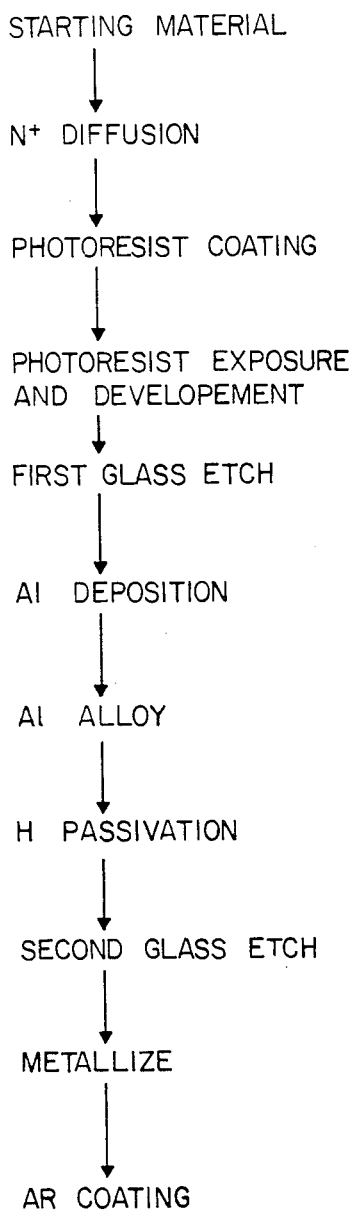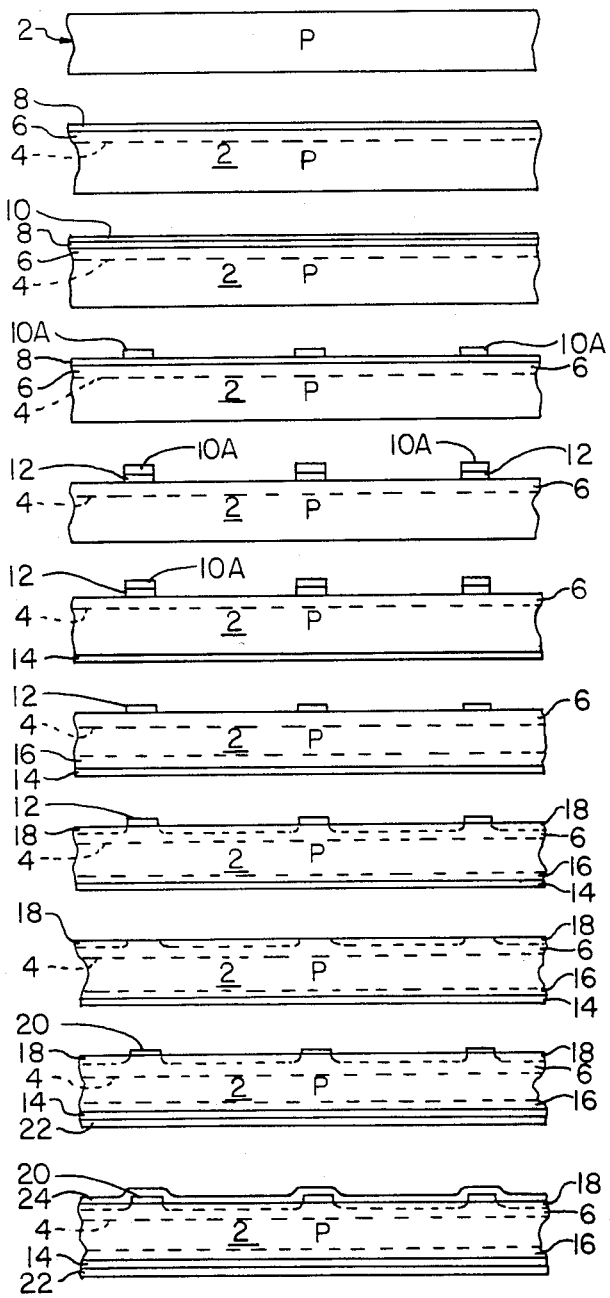

METHOD OF FABRICATING SOLAR CELLS

This application is a continuation-in-part of application Ser. No. 666,972, filed Oct. 31, 1984, now abandoned, which is a continuation of application Ser. No. 563,292, filed Dec. 19, 1983, now abandoned.

BACKGROUND OF THE INVENTION

This invention pertains to the manufacture of photovoltaic cells and more particularly to an improved low-cost method of fabricating polycrystalline silicon solar cells wherein the damaged surface layer generated during hydrogen passivation is used as a plating mask for the metallization of the front surface electrodes.

Heretofore a common method of fabricating silicon solar cells has included the steps of forming a PN junction by diffusing a suitable dopant into the front side of a silicon wafer or ribbon, etching a grid electrode pattern in a protective dielectric masking layer formed on that front surface, depositing a nickel plating on all silicon exposed by the etching, overplating the nickel with copper and tin, removing the remainder of the dielectric masking layer from the front surface, and providing an anti-reflection coating on the newly exposed portions of the front surface.

While such a procedure may be applied to either single crystal or polycrystalline silicon, cost considerations make it desirable to fabricate solar cells from the latter. However, as is well known, because of the minority carrier losses at grain boundaries, dislocations, and the like, the efficiencies achieved with polycrystalline silicon solar cells are generally poorer than those of monocrystalline cells. This circumstance has been improved upon by introducing a monovalent element, such as hydrogen, into the structure to combine with the dangling bonds associated with the structural defects, thereby minimizing the minority carrier recombination loss.

As is known in the art, an important consideration in designing a cell processing sequence is that the combination of time and temperature in any step following the hydrogen passivation step should not cause the hydrogen introduced into the silicon to be diffused back out of the passivated substrate. Thus, for instance, it has been found that a hydrogen passivated cell subjected to a temperature of 600° C. for one-half hour in a vacuum loses substantially all the bonded hydrogen and returns to its pre-passivation level, as evidenced by its observed electron beam induced current activity. It should be noted in this regard that the function diffusion step in solar cell fabrication typically involves temperatures on the order of 900° C.

It has also been found that hydrogen passivation normally heats the cell to a high enough temperature to cause base metals, such as copper, to migrate through the junction, thereby causing a "soft" diode or a short circuit. As shown, for instance, by C. H. Seager, D. J. Sharp, J. K. G. Panitz, and R. V. D'Aiello in *Journal of Vacuum Science and Technology*, Vol. 20, no. 3, pp 430–435 (March 1982), passivation of polycrystalline silicon may be accomplished with a Kaufman-type ion source used to produce a hydrogen ion beam in the kilo electron volt energy range. Relatively short exposure times (e.g. between 0.5 and 4 minutes) in a high ion energy and flux (e.g. 1 to 3 milliamperes per square centimeter) range appear to be optimal. Such exposures generally result in the substrate temperature rising to at least approximately 275° C., if the substrate is carefully contacted to an appropriate heat sink. Otherwise, temperatures in excess of 400° C. are readily achieved. It is important, however, that temperatures be limited to less than about 300° C. to avoid rapid migration of base metals into the silicon matrix. However, manipulation of substrate and heat sink to effect thermal control during passivation easily becomes the rate limiting factor in high throughput processing with such ion sources. Consequently, it is desirable to avoid heat sinking in order to obtain a low cost, high throughput process. Additionally, for EFG-type silicon ribbon, which may be economically produced, surface irregularities make heat sinking difficult.

Additionally, hydrogen passivation is most effective when the base silicon surface is exposed. Thus, any "positive" plating mask used to define the front surface grid electrode pattern by covering the interelectrode area of the front surface should not be in place during passivation.

As described in copending application Ser. No. 563,061, the altered surface layer produced in hydrogen ion beam passivation may be used as a plating mask for subsequent metallization steps involving immersion plating of a selected metal. A preferred embodiment of the process described in detail in application Ser. No. 563,061 as applied to the manufacture of silicon solar cells involves, inter alia, the following steps: (1) forming a plating mask of a dielectric material on the front surface of a shallow-junction silicon ribbon so as to leave exposed those areas of the silicon to be later covered by the front surface electrode, (2) depositing a thin layer of nickel (or similar material) on the exposed silicon, (3) removing the plating mask, (4) hydrogen passivating the junction side of the cell, (5) sintering the nickel to form in part a nickel silicide, (6) immersion plating additional nickel onto the metal-covered portions of the cell, (7) electroplating a layer of copper onto the nickel, and (8) applying an anti-reflection coating over the exposed surface of the silicon. Thereafter, the silicon may be further processed, e.g. to prepare it for connection to electrical circuits. In an alternative process, the heating of the sample during passivation supplies at least part of the energy for the nickel sintering step.

While it will be appreciated that such a procedure (1) permits the removal of the initial plating mask prior to passivation (permitting better passivation) and (2) allows passivation prior to the application of base metals without the requirement of an additional masking step prior to metallization (both eliminating the danger of spoiled cells caused by migration of the base metal during passivation and simplifying the production process by eliminating the need either for close thermal control of the substrate during passivation or for a photolithographic step following passivation), the process may still be improved. Thus, although the thermal control required to prevent base metal migration (temperatures preferably less than about 300° C.) is obviated, there is still the danger of spoiled cells due to migration, albeit at a slower diffusion rate, of nickel or nickel silicide within the matrix of the substrate.

Further, the method just outlined requires the formation of a plating mask, as an additional layer on the substrate, prior to the initial metallization, and to this extent requires additional processing and materials.

OBJECTS OF THE INVENTION

Accordingly, it is an object of the present invention to provide a processing sequence for the fabrication of solar cells including a hydrogen passivation step after the high temperature processing steps yet before any front surface metallization.

It is another object of the present invention to provide such a processing sequence which does not require the formation of a plating mask to prevent metallization of the exposed passivated surface after hydrogen passivation.

BRIEF DESCRIPTION OF THE INVENTION

These and other objects are realized by a process which, in a preferred embodiment as applied to the manufacture of silicon solar cells involves, inter alia, the following steps: (1) diffusing phosphorus into P-type silicon ribbon so as to form a shallow junction, the diffusion process simultaneously forming a layer of phosphosilicate glass on the surface of the ribbon adjacent the junction, (2) forming a grid electrode pattern of the phosphosilicate glass layer by photolithography (using a suitable photoresist composition and etching) in the form of a "negative" plating mask (i.e., leaving phosphosilicate glass only on those regions of the substrate where it is desired to subsequently attach the front surface electrodes), (3) coating the other side of the silicon ribbon with an aluminum paste, (4) heating the silicon so as to alloy the aluminum, (5) hydrogen passivating the junction side of the cell while simultaneously forming an altered layer in the uncovered silicon substrate between the phosphosilicate glass electrode pattern, (6) etching off the remaining phophosilicate glass, and (7) metallizing both the non-altered exposed silicon and the aluminum with a selected metal such as nickel, by immersion plating. Thereafter, the silicon may be further processed, e.g. to prepare it for connection to electrical circuits, and provided with an antireflection coating.

As used herein the term "immersion plating" means a process wherein an object is plated with a metal without the use of an externally applied electric field by immersing that object in a plating bath that does not contain a reducing agent, and the plating involves a displacement reaction. Immersion plating is distinguished from electroless plating in that the latter involves a plating bath that contains a reducing agent.

This fabrication sequence has several key advantages. By delaying the deposition of the front surface electrodes until after passivation, all danger of the cell's being spoiled by migration of the electrode's material to the junction during subsequent processing steps is greatly reduced. As thermal control during passivation is less critical, heat sinking may be avoided. Therefore, the present process permits high throughput ion beam passivation. Additionally, the preferred method, by making use of the glass layer formed as a consequence of the method of forming the junction as the body of a negative plating mask, eliminates both an etching step (to initially remove the glass) and a coating step (to provide material for a plating mask), the glass instead being removed in two stages.

Other objects of the invention will in part be obvious and will in part appear hereinafter. The invention accordingly comprises the several steps and the relation of one or more of such steps with respect to each of the others which are exemplified in the following detailed disclosure, and the scope of the application of which will be indicated in the claims.

BRIEF DESCRIPTION OF THE DRAWING

For a fuller understanding of the nature and objects of the present invention, reference should be had to the following detailed description which is to be considered together with the accompanying drawing which illustrates a number of the steps involved in making solar cells according to a preferred form of the invention.

Throughout the drawing, like reference numbers refer to similar structure.

In the drawing, the thicknesses and depths of the several coatings and regions are not shown exactly in accordance with their relative proportions, for convenience of illustration.

DETAILED DESCRIPTION OF THE INVENTION

Referring now to the drawing, the preferred embodiment of the invention relates to the production of solar cells from EFG grown P-type silicon ribbon. As a first process requirement, one side (hereafter the "front side" of a pre-cleaned EFG P-type conductivity silicon ribbon 2 is subjected to a phosphorus diffusion process calculated to produce a relatively shallow junction 4 (i.e., a function of between about 3,000 and about 7,000 Angstrom units deep), an N-type conductivity region 6, and a reasonably thick (e.g., on the order of at least 1500 Angstrom units) layer of phosphosilicate glass 8. As an example, a silicon ribbon of P-type conductivity made by the edge-defined film-fed growth (EFG) process and having a resistivity of about 5 ohm-cm is cleaned by etching in a solution of $HNO_3(70\%):HF(49\%)$ in a ratio of between about 4:1 and 9:1 for about one to three minutes at about 25° C. Thereafter, the ribbon is subjected to phosphorus diffusion in an oxygen-rich atmosphere. In this example, silicon and oxygen react to form silicon dioxide, phosphorus and oxygen react to form phosphorus pentoxide, phosphorus pentoxide and silicon oxide react to form a phosphosilicate glass, and phosphorus pentoxide and silicon react to form phosphorus and silicon dixode. Alternatively, a phosphosilicate glass, formed as detailed in U.S. Pat. No. 4,152,824, may be used as the source for the phosphorus.

The next step involves coating the front side of the ribbon with a negative photoresist 10, as well known in the art. The resist may be applied in a suitable manner, e.g., as by spraying, and then baked to drive off the organic solvents and cause the resist to adhere firmly to the phosphosilicate glass. Typically, this baking is achieved by heating the photoresist to between about 80° C. and 110° C. for between about 35 and about 60 minutes.

The photoresist layer is then covered with a negative mask in the pattern of a multi-fingered grid electrode, e.g., a mask having transparent areas corresponding to the fingers of the desired electrode and opaque elsewhere. As an example of a suitable electrode pattern, reference may be had to U.S. Pat. No. 3,686,036. The grid mask is then irradiated with ultraviolet light of a sufficient intensity and for sufficient time so as to cause the illuminated portion of the photoresist to polymerize. Next, the photoresist is developed by treatment with one or more suitable developing agents, as for instance by contact with toluene and propanol or other suitable solvents. This development process removes those portions of the resist which have not been irradiated and hence have not been polymerized. There thus remains a portion 10A of the photoresist in the pattern of the desired grid electrode configuration. A post development bake at about 140° C. has been found to improve the etch resistance of the remaining photoresist in the following processing step.

Following photoresist exposure and development (and post development bake), the assembly is subjected to a buffered oxide etch consisting, e.g., of a solution of HF and NH$_4$F, whereby the exposed layer of phosphosilicate glass 8 is removed. Thus, (P$_2$O$_5$)$\times$(SiO$_2$)$_y$, a phosphosilicate glass, may be removed from the substrate by submerging the latter in 10NH$_4$F(40%):1HF at a temperature of about 25° C. for a period between about 15 seconds and 2 minutes. This leaves intact a layer 12 of phosphosilicate glass, in the pattern of the grid-electrode configuration, under the polymerized, unremoved portion 10A of the photoresist.

Next, the rear side of the substrate is coated with a layer 14 of an aluminum paste. The aluminum paste used to form layer 14 preferably comprises aluminum powder in a volatile organic vehicle, such as terpineol, that can be removed by evaporation.

This step is then followed by an alloying step in which the substrate is heated for about 0.25 to 2.0 minutes to a temperature greater than 575° to remove any volatile or pyrolyzable organic components of the paste and to alloy the aluminum in the paste to the silicon substrate.

In the alloying step, the aluminum coating 14 alloys with the back side of the substrate to provide a P+region 16 having a depth of from about 1 to about 5 microns. The alloying step also serves to remove the remaining resist portion 10A by pyrolysis.

Next, the cell is hydrogen passivated. A preferred method is to expose the front surface of substrate 2 to the hydrogen ion beam of a Kaufman-type (broad beam) ion source situated about 15 cm from the substrate. This ion source is preferably operated at a pressure of between about 20 and 50 millitorr (of hydrogen), with a hydrogen flow rate on the order of about 25 to 40 s.c.c. per minute, with a potential of about 1700 volts d.c. between source and substrate, and with a beam current of between about 1 and 3 milliampere/cm$^2$ at the substrate. An exposure time of between about 1 and about 4 minutes has been found adequate both to minimize the minority carrier recombination losses typically experienced with EFG-type silicon cells (providing a passivation zone some 20 to 80 microns deep, or about 100 times as deep as junction 4) while simultaneously providing an altered surface layer 18 approximately 200 Angstrom units deep on the exposed portions of substrate 2.

The exact nature of altered surface layer 18 is not known. However, it is believed to be a damaged zone wherein the crystal structure has been somewhat disrupted, the silicon in part forming SiH or SiH$_2$ with hydrogen from the ion beam, yet wherein the material is possibly amorphous. A small amount of carbon or one or more hydrocarbons appear to be necessary for the formation of the desired altered surface layer. As initially installed, the Kaufman ion source used was equipped with a graphite mounting stage about 5 inches (c. 13 cm) in diameter on which the substrates, typically 2 by 4 inches (5 by 10 cm) on a side, were centrally located. In some cases, when a silicon mounting stage was substituted for the graphite stage, the altered layer did not perform as a plating mask as well as when the graphite stage was employed. On the basis of this, it has been hypothesized that carbon or hydrocarbon vapor formed by the impact of the hydrogen ion beam on the graphite stage may enhance the formation of a dielectric layer on the surface of the substrate. Whatever its nature, it has been found that an altered surface layer 18 produced in accordance with this procedure with accelerating voltages between about 1400 and about 1700 volts and exposure times as short as 1 minute is sufficient to prevent subsequent metallization of the exposed altered surface layer 18 where the metallization involves immersion plating of a material such as nickel.

Following passivation, the remaining phosphosilicate glass layer 12 is removed by immersing the substrate in a buffered solution of 10NH$_4$F(40%):1HF at a temperature of between about 25° C. and about 40° C. As a result, the front surface of substrate 2 is now completely exposed. On this exposed surface, altered surface layer 18 delimits a pattern of, in this case, unaltered N+conductivity silicon having the configuration of the desired front electrode structure.

Next, metallization of the cell is undertaken. The substrate is immersion plated with nickel, an adhesive deposition of nickel forming a nickel layer 22 on the back side over the entire area of the aluminum coating 14, while the adhesive deposition of nickel on the front side forms a layer 20 directly on the surface of substrate 2 only over those areas from which phosphosilicate glass layer 12 was removed following passivation. In this plating step, the altered surface layer 18 of the silicon forms a plating mask to which the nickel does not adhere. Plating of the nickel layers may be done according to various immersion plating methods. Preferably it is accomplished in accordance with an immersion plating process like or similar to the process described in U.S. Pat. No. 4,321,283 of Kirit Patel, et al. As a preliminary step, the cleaned silicon substrate surface is pre-activated with a suitable agent. This pre-activation procedure is desirable since often the silicon surface will not itself support the electroless plating process, and any nickel plated on an untreated surface generally adheres thereto only poorly. Preferably, gold chloride is used as the activating agent, although platinum chloride, stannous chloride - palladium chloride, or other well known activators may be used, as described, for instance, in U.S. Pat. No. 3,489,603. Thereafter, both sides of the silicon ribbon are coated with a layer of nickel, preferably by immersing the ribbon in an aqueous bath as disclosed in said U.S. Pat. No. 4,321,283, or an aqueous bath of nickel sulfamate and ammonium fluoride at a pH of about 2.9 and at approximately room temperature for a period of about 2 to 6 minutes.

After the nickel has been applied, the substrate is heated in an inert or a nitrogen atmosphere to a temperature and for a time sufficient to sinter the nickel layers and cause the nickel layer 20 on the front side of the substrate to react with the adjacent silicon to form a nickel silicide ohmic contact. For this purpose, the substrate is preferably heated to a temperature of about 300° C. for between about 15 and about 40 minutes. This provides a nickel silicide layer with a depth of about 300 Angstrom units at the interface between nickel layer 20 and substrate 2. The nickel layer 18 on the rear side forms an alloy with aluminum layer 12. The temperature of this sinstep should not greatly exceed 300° C., as higher temperatures lead to excessive penetration into the silicon of nickel layer 20. Preferably, the deposition and sintering of the nickel is controlled such that nickel layer 20 on the front side of the substrate has a thickness of about 1000 Angstrom units.

Thereafter, the nickel of layers 18 and 20 are preferably subjected to etching, as with nitric acid, and to further metallization, as with a second layer of nickel by immersion plating and one or more layers of copper by immersion plating and/or electroplating, by techniques well known in the art. No masking of the altered layer is required for the copper plating since the copper will not adhere to the damaged layer.

Following metallization, the cell edges (not shown) are trimmed, and an anti-reflection coating 24 is applied to the front surface of the cell. This may be accomplished by any of a number of known methods, such as by chemical vapor deposition or evaporation of, for instance, $TiO_2$. Alternatively, anti-reflection coating 24 may be formed by the plasma deposition of silicon nitride at a temperature of about 150° C., as is well known in the art.

By way of example, the preferred method of practicing the present invention comprises performing the individual steps set forth hereinabove in the preferred mode described in detail for each step and in the sequence set forth.

It has been determined that solar cells made according to the foregoing process from EFG grown ribbons show between a 10 and 20% increase in average efficiency. In addition, for this material the hydrogen passivation step has also been found to markedly narrow the distribution of cell efficiencies.

The present process has a number of advantages. Primarily, it eliminates the possiblity of junction 4 being spoiled by migration of nickel or nickel silicide during passivation, as might occur in shallow junction cells if an initial nickel coating were deposited on the front surface prior to passivation. Aside from reducing the possibility of spoiled cells, this relaxes the requirements for close thermal control (as by heat sinking) during passivation. It therefore make possible a high-throughput ion-beam passivation step in the manufacturing process.

It will be realized that the present invention is capable of modification while remaining within the scope of the disclosure. Thus, while in the preferred embodiment the front electrode grid pattern is formed in the plating mask by photolithography, it will be understood that it might equally well be formed by other processes commonly employed in chemical milling (e.g., silk screen printing).

Then too, although the preferred method makes use of the phosphosilicate glass formed during N+ diffusion to form the ion beam mask to define the damage layer pattern, other materials or processes could be used for the front surface layer. Thus, an N-type substrate might be used as the starting material, the junction being formed for instance by diffusion with boron, thereby providing a borosilicate glass layer. Yet again, if the starting material were to be supplied with a junction and without a glass layer, an appropriate layer would have to be provided. It will be appreciated that the layer provided may either be capable of being etched to form a suitable plating mask or might itself be deposited in the appropriate configuration.

Again, while the preferred embodiment of the method of the present invention makes use of the altered layer formed by hydrogen passivation to mask subsequent plating except on earlier plated nickel, the method may be used with other metals than nickel. For instance, as will be understood by those skilled in the art, the initial layer of the front surface electrodes on a shallow junction silicon device may be deposited by plating any of a number of low reactivity materials capable of forming (preferably at a low temperature) an ohmic contact and serving as a barrier to the diffusion of copper or any other base metal deposited at a later stage. Suitable metals for use with copper include palladium, platinum, cobalt, and rhodium, as well as nickel. While all of these materials form silicides, a silicide layer is not essential. It is important, however, that the initial metal layer adhere properly, serve as an ohmic contact, and act as a barrier to the migration of any metal deposited later, as well as not significantly migrating to the junction itself. These materials may be applied by immersion plating techniques in the same manner as nickel.

Still other changes may be made without departing from the principles of the invention as, for example, (a) forming the P+ back region of the cell by using flame sprayed aluminum instead of an aluminum paste, or (b) using different methods of applying the second and subsequent coatings of nickel or other low reactivity material such as palladium, platinum, cobalt, and rhodium, or (f) forming the junction by ion implantation. If no additional masking layer is deposited over the passivated areas, the layer of nickel (or other low reactivity metal of the type described) must be applied by immersion plating and the additional layers of copper must be applied by electroplating or immersion plating.

Of course, the process provided by this invention is not limited to the production of solar cells from EFG substrates. Thus, for example, cast polycrystalline substrates, epitaxial silicon on metallurgical grade silicon or fine grade polysilicon layers formed by chemical or physical vapor deposition can be used to form relatively high efficiency solar cells according to the present invention. Further, the process is applicable to single crystal silicon, and may be practiced with N-type as well as P-type silicon.

Further, the method might be employed in the fabrication of Schottky barrier devices, the altered surface layer serving as a mask for the metallization. For such applications, it will be understood, the metal-substrate interface is the junction, and the substrate consequently would not be provided with a junction by diffusion of phosphorus or the like.

Since these and other changes may be made in the above processes without departing from the scope of the invention herein involved, it is intended that all matter contained in the above description or shown in the accompanying drawing shall be interpreted in an illustrative and not a limiting sense.

What is claimed is:

1. A method of fabricating solid state semiconductor devices comprising in sequence the steps of:
    (a) providing a silicon substrate having opposing first and second surfaces and having on said first surface a mask in the form of a surface layer with a predetermined two-dimensional pattern therethrough exposing selected portions of said first surface;
    (b) exposing said first surface to a hydrogen ion beam of an intensity and for a duration sufficient to form a surface layer on said selected exposed portions of said first surface to which metals will only poorly adhere;
    (c) removing said mask; and (d) subjecting said first surface to metal plating so that a metal layer is formed on all portions of said first surface other than said selected exposed portions.

2. The method according to claim 1 and further including the step of forming a junction adjacent said first surface prior to said hydrogen beam exposure.

3. Method according to claim 1 wherein said devices are photovoltaic.

4. Method according to claim 3 further including the step of applying an anti-reflection coating so as to cover said first surface.

5. A method of fabricating solid state semiconductor devices comprising in sequence the steps of:
    (a) providing a silicon substrate having opposing first and second surfaces;
    (b) forming a surface layer on said first surface of said substrate;
    (c) forming a mask in said surface layer by selectively etching a predetermined two-dimensional pattern therethrough, thereby selectively exposing portions of said first surface;
    (d) exposing said first surface to a hydrogen ion beam of an intensity and for a duration sufficient to form a surface layer on said selected exposed portions of said first surface to which metals will only poorly adhere;
    (e) removing said mask; and
    (f) metallizing said first surface.

6. The method according to claim 5 wherein said surface layer is a glass layer formed as a consequence of the diffusion of a junction in said substrate adjacent said first surface.

7. The method according to claim 6 wherein said junction is formed by diffusing phosphorous into said silicon substrate, thereby forming a phosphosilicate glass surface layer.

8. The method according to claim 5 wherein said mask is formed by photolithography using a photoresist covering said first surface.

9. The method according to claim 8 including the further steps of applying a coating of aluminum to said second surface prior to removal of said photoresist and thereafter heating said silicon substrate to a temperature and for a time sufficient to (1) cause the aluminum of said coating to alloy with said silicon substrate and (2) effect removal of said photoresist by pyrolysis.

10. Method according to claim 5 wherein both of said first and second surfaces are metallized.

11. Method according to claim 5 wherein said surface layer is a dielectric.

12. Method according to claim 5 further including the step of applying a coating of aluminum to said second surface prior to metallization of said first surface, and heating said aluminum to a temperature and for a time sufficient to cause the aluminum to alloy with said silicon substrate.

13. A method of fabricating solid state semiconductor devices comprising in sequence the steps of:
    (a) providing a silicon substrate having opposing first and second surfaces;
    (b) forming a junction in said substrate adjacent said first surface and simultaneously forming on said first surface a glass layer;
    (c) covering said glass layer with an adherent coating of a photoresist material;
    (d) exposing said adherent coating to radiant energy through a mask defining a predetermined two-dimensional pattern;
    (e) chemically developing said adherent coating so that selected portions of said adherent coating are removed from said glass layer according to said predetermined pattern;
    (f) removing those portions of said glass layer which are not covered by said adherent coating so as to uncover selected portions of said first surface;
    (g) applying a coating of aluminum to said second surface;
    (h) heating said silicon substrate to a temperature and for a time sufficient to (1) cause the aluminum of said coating of aluminum to alloy with said silicon substrate and (2) effect removal of said adherent coating by pyrolysis;
    (i) exposing said first surface to a hydrogen ion beam of an intensity and for a duration sufficient to form a surface layer on said uncovered selected portions of said first surface to which metals will only poorly adhere;
    (j) removing said glass layer; and
    (k) metallizing said first and second surfaces.

14. The method according to claim 13 wherein said first surface is exposed to said hydrogen ion beam for a time and intensity sufficient to decrease the minority carrier losses of said substrate.

15. Method according to claim 13 wherein said metallization is performed using a metal chosen from the group of metals including nickel, palladium, cobalt, platinum, and rhodium.

16. Method according to claim 13 wherein said metallization comprises plating nickel from a bath comprising a nickel salt and fluoride ions.

* * * * *